(12) United States Patent
Hajibabaeinajafabadi et al.

(10) Patent No.: US 12,332,568 B2
(45) Date of Patent: Jun. 17, 2025

(54) METAL OXIDE RESISTS FOR EUV PATTERNING AND METHODS FOR DEVELOPING THE SAME

(71) Applicant: Tokyo Electron Limited, Tokyo (JP)

(72) Inventors: Hamed Hajibabaeinajafabadi, Albany, NY (US); Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 388 days.

(21) Appl. No.: 17/880,479

(22) Filed: Aug. 3, 2022

(65) Prior Publication Data

US 2024/0045337 A1    Feb. 8, 2024

(51) Int. Cl.
| | |
|---|---|
| G03F 7/38 | (2006.01) |
| G03F 7/004 | (2006.01) |
| G03F 7/36 | (2006.01) |
| G03F 7/40 | (2006.01) |
| H01L 21/027 | (2006.01) |
| H01L 21/033 | (2006.01) |
| H01L 21/3065 | (2006.01) |
| H01L 21/308 | (2006.01) |
| H01L 21/311 | (2006.01) |
| H01L 21/768 | (2006.01) |

(52) U.S. Cl.
CPC .............. *G03F 7/38* (2013.01); *G03F 7/0042* (2013.01); *G03F 7/0043* (2013.01); *G03F 7/36* (2013.01); *G03F 7/40* (2013.01); *H01L 21/0274* (2013.01); *H01L 21/0337* (2013.01); *H01L 21/3065* (2013.01); *H01L 21/308* (2013.01); *H01L 21/31122* (2013.01); *H01L 21/31144* (2013.01); *H01L 21/76898* (2013.01)

(58) Field of Classification Search
None
See application file for complete search history.

(56) References Cited

U.S. PATENT DOCUMENTS

| | | |
|---|---|---|
| 11,079,682 B1 | 8/2021 | Han et al. |
| 2022/0004105 A1 | 1/2022 | Dai et al. |
| 2022/0020584 A1 | 1/2022 | Volosskiy et al. |
| 2024/0329538 A1* | 10/2024 | Li .................. G03F 7/0043 |

FOREIGN PATENT DOCUMENTS

| | | | |
|---|---|---|---|
| WO | 2020264158 A1 | 12/2020 | |
| WO | WO2020264158 | * 12/2020 | ............. G03F 7/36 |
| WO | 2021158433 A1 | 8/2021 | |
| WO | WO2023114724 | * 6/2023 | ............ G03F 7/004 |

OTHER PUBLICATIONS

International Search Report and Written Opinion, International Application No. PCT/US2023/028364, dated Nov. 10, 2023, 10 pages.

\* cited by examiner

*Primary Examiner* — Jiong-Ping Lu
(74) *Attorney, Agent, or Firm* — Slater Matsil, LLP

(57) ABSTRACT

A method for processing a substrate includes forming a metal oxide resist over the substrate, exposing the metal oxide resist to an extreme ultraviolet light pattern, and flowing a selective gas over the metal oxide resist. The selective gas increases a selectivity of the exposed metal oxide resist to a developing gas. The method further includes flowing the developing gas over the metal oxide resist in a processing chamber and etching the substrate using remaining portions of the metal oxide resist as a mask.

20 Claims, 11 Drawing Sheets

METAL OXIDE RESISTS FOR EUV PATTERNING AND METHODS FOR DEVELOPING THE SAME

TECHNICAL FIELD

The present invention relates generally to the field of semiconductor manufacturing and semiconductor devices, and, in particular embodiments, to methods of processing substrates with extreme ultraviolet (EUV) patterning.

BACKGROUND

Photolithography is commonly used to pattern thin films during semiconductor processing, where photons are emitted from a light source onto a photosensitive photoresist to initiate a chemical reaction in the photoresist. Thereafter, the photoresist is developed and exposed or unexposed portions of the photoresist are removed to form a pattern or a mask.

Scaling of semiconductor devices has enabled significant technological advances, including advanced lithographic techniques such as immersion lithography. Extreme Ultraviolet (EUV) radiation can be used for providing improved pattern resolution in advanced integrated circuits where reduction in feature sizes is required. Common EUV photoresists are polymer-based chemically amplified resists (CARs) that are deposited on substrates using liquid-based spin-on techniques that consume a significant amount of complex precursors. Recently, inorganic-based resists have received interest as they may be patterned using EUV radiation and can offer the high etch resistance and etch selectivity needed for semiconductor manufacturing. However, processing and development of inorganic-based resists presents new challenges.

SUMMARY

In accordance with an embodiment, a method for processing a substrate includes: receiving a first substrate with an exposed metal oxide resist in a processing chamber, the exposed metal oxide resist including exposed portions and unexposed portions; flowing a selective gas over the exposed metal oxide resist, where the selective gas increases a selectivity between the exposed portions and unexposed portions of the exposed metal oxide resist to a developing gas; and flowing the developing gas over the exposed metal oxide resist in the processing chamber.

In accordance with another embodiment, a method for processing a substrate includes: forming a metal oxide resist over the substrate; exposing the metal oxide resist to an extreme ultraviolet light pattern; flowing a first selective gas over the metal oxide resist in a processing chamber; after flowing the first selective gas, simultaneously flowing a developing gas and a second selective gas over the metal oxide resist in the processing chamber, wherein the developing gas includes an element that is not part of the first selective gas or the second selective gas; and etching the substrate using remaining portions of the metal oxide resist as a mask.

In accordance with yet another embodiment, a method for processing a substrate includes: forming a metal oxide resist over the substrate; exposing the metal oxide resist to an extreme ultraviolet light pattern; flowing a first developing gas over the metal oxide resist in a processing chamber; purging the first developing gas from the processing chamber with a first selective gas, the first selective gas having a different molecular structure from the first developing gas; after purging the first developing gas, flowing a second developing gas over the metal oxide resist in the processing chamber; and etching the substrate using remaining portions of the metal oxide resist as a mask.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of developing inorganic resists (e.g., metal oxide resists) for EUV patterning that improve selectivity of the development process. The addition of a secondary gas, referred to as a selective gas, to a processing chamber with a developing gas may increase selectivity of the development process (e.g., a dry etch process) with respect to exposed and unexposed areas of photoresist films. The selective gas may be introduced into the process chamber in different ways: as a treatment step prior to introducing the developing gas, simultaneously with the developing gas, as alternating steps with the developing gas in a cyclic fashion, or as a combination of some or all of these approaches. Embodiments may increase selectivity of the development etch. This may improve the mask budget for pattern transfer by allowing thicker resist to be left after development. This can enable pattern transfer to thicker underlying layers. Embodiments may allow for reduction of development dose and exposure time, which can increase process throughput. Embodiments may also allow for tuning of the selectivity of the development process by selecting appropriate chemistry for the selective gas. For example, the selectivity of the development process may be reversed, e.g. a negative-tone photoresist may become a positive-tone photoresist.

Embodiments of the disclosure are described in the context of the accompanying drawings. An embodiment of an example fabrication process including formation and exposure of an EUV-sensitive photoresist film will be described using FIGS. 1A-1C. Embodiments of example developing processes including developing and selective gases will be described using FIGS. 2A-2C. Embodiments of example fabrication processes for forming conductive features in and over a substrate will be described using FIGS. 3A-3D. Embodiments of methods for processing substrates including the flowing of developing and selective gases will be described using FIGS. 4, 5, 6, 7, 8, 9, 10, and 11.

Figure 1A:
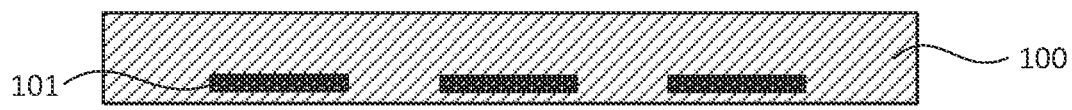
FIGS. 1A-1C illustrate steps of an example fabrication process for forming and exposing a photoresist, in accordance with various embodiments.
Figure 1B:
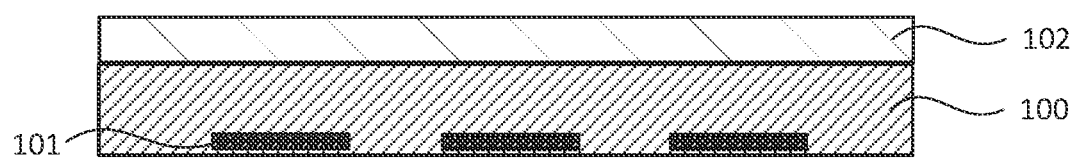
Figure 1C:
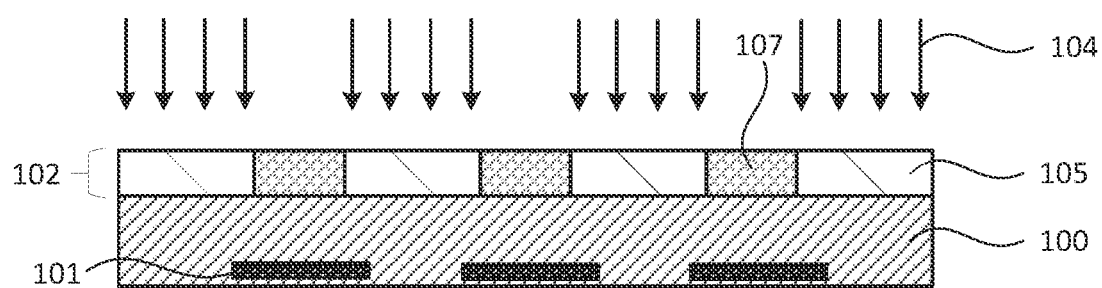

FIGS. 1A-1C illustrate steps of an example fabrication process including formation and exposure of an EUV-sensitive photoresist film. FIG. 1A illustrates a cross-sectional view of an example substrate 100 to be patterned. For example, the substrate 100 may be a silicon wafer having a diameter in a range of 100 mm to 500 mm, such as a diameter of 150 mm, 200 mm, 300 mm, or 450 mm. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise silicon germanium, silicon carbide, gallium arsenide, gallium nitride, or other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device. In some embodiments, the substrate 100 comprises conductive features 101 (e.g., metal lines) embedded therein. The conductive features 101 may be electrically coupled to active devices (not illustrated) further embedded in the substrate 100.

FIG. 1B illustrates a cross-sectional view of the substrate 100 after depositing a photoresist film 102 (e.g., a metal oxide resist) over the substrate 100. In various embodiments, although not illustrated, the substrate 100 may further comprise various layers useful for semiconductor device fabrication, which may be collectively regarded as a part of the substrate 100 in this disclosure. For example, in certain embodiments, over the substrate 100, there may be a dielectric layer comprising a silicon-based dielectric material with a low dielectric constant (i.e., low-k value) such as organosilicate glass (SiCOH), dense SiCOH, porous SiCOH, and other porous dielectric materials. Further, there may be a hard mask layer over the substrate 100, which may be patterned in subsequent etch processes after the EUV photopatterning. In various embodiments, the hard mask may comprise titanium nitride, titanium, titanium oxide, tantalum, tungsten carbide, other tungsten based compounds, ruthenium based compounds, or aluminum based compounds. The hard mask may also be carbon-based or silicon-based mask materials.

In one example illustrated in FIG. 1B, the photoresist film 102 is formed over the substrate 100. In addition, the photoresist film 102 may be formed as a part of a tri-layer stack commonly used for photolithographic patterning. The tri-layer stack may be used to generate and transfer a pattern to the hard mask and then, for example, underlying layers such as the dielectric layer of the substrate 100. In various embodiments, the multi-layer stack comprises an underlayer and the photoresist film 102 over the underlayer as an EUV-sensitive photoresist. In one or more embodiments, the underlayer comprises carbon materials (e.g., silicon carbide or silicon oxycarbide) and may be formed via a spin-on process or vapor deposition such as CVD. The multi-layer stack may further comprise layers of oxide (e.g., silicon oxide) or nitride (e.g., titanium nitride or silicon nitride) above the underlayer and the photoresist film 102. For simplicity of illustration, FIG. 1B illustrates only the photoresist film 102 directly deposited on the substrate 100, but as described above, any suitable multi-layer structure may be present as a part of the substrate 100 in various embodiments.

In various embodiments, the photoresist film 102 comprises tin (Sn), antimony (Sb), hafnium (Hf), zirconium (Zr), zinc (Zn), the like, or a combination thereof. In certain embodiments, the photoresist film 102 comprises a metal oxide, a metal alkoxide, or a methacrylate (MAA) of Sn, Sb, Hf, Zr, Zn, or the like, such as ZrMAA, SbMAA, SbMAA:F, HfMAA, ZnMAA, and ZnMAA:F. In certain embodiments, the photoresist film 102 may be a network of metal oxide comprising a metal alkoxide, metal alkenoxide, metal aryloxide, or metal carboxylate group. These groups bonded to the metal are generally represented by chemical formulas, —OR, —OR', —OAr, and —OOCR, respectively, where R is an alkyl group, R' is an alkene group, and Ar is an aryl group. In various embodiments, the photoresist film 102 is a polymeric film, and may not have a highly ordered structure such as crystalline. The number of the above functional groups bonded to the metal atom may differ for each metal atom, ranging between 1 and 4. The deposition of the photoresist film 102 may be performed by a dry or wet process. In various embodiments, the photoresist film 102 may be deposited by vapor deposition, for example chemical vapor deposition (CVD), plasma-enhanced CVD (PECVD), atomic layer deposition (ALD), or plasma-enhanced ALD (PEALD).

In certain embodiments, the deposition process for the photoresist film 102 may comprise exposing the substrate 100 to two precursors in a process chamber: a metal-containing precursor (e.g., a tin-containing precursor) and an oxygen-containing precursor. The exposures to these precursors may be performed stepwise or simultaneously. In various embodiments, the deposition process may be an ALD or pseudo-ALD process and comprise two or more exposing steps. For example, the deposition process may be performed by first exposing the substrate 100 to the tin-containing precursor that forms an adsorbed layer on the substrate 100 and, thereafter, exposing the substrate 100 to the oxygen-containing precursor gas that reacts with the adsorbed tin-containing precursor. The exposing steps may be repeated one or more times to increase a thickness of the photoresist film 102 on the substrate 100. In certain embodiments, the exposing steps may be separated temporally or spatially. Temporally separating the exposing steps may be realized by changing the gas composition in a process chamber. On the other hand, spatially separating the exposing steps may be enabled by utilizing multiple spatially segregated sections within the process chamber and transporting the substrate from one section to another. For temporally separating the exposing steps even better, the vapor deposition may further include evacuating, purging, or both evacuating and purging, the process chamber between the exposing steps. These additional steps may be beneficial in ensuring the reaction occurs only on surface and not in the gas phase. The ALD or pseudo-ALD method in accordance with this embodiment may be particularly advantageous in enabling layer-by-layer growth of the photoresist film 102 with a high uniformity.

In another embodiment, instead of the ALD type process, the precursors may be supplied in the process chamber simultaneously to grow the photoresist film 102. Such an embodiment may be advantageous by allowing the continuous growth of the photoresist film 102 in a single step. In this embodiment, the reaction between the precursors may or may not occur in the gas phase as well as on surface.

In other embodiments, the photoresist film 102 may be deposited by liquid deposition using alternate exposures of a tin-containing precursor liquid and an oxygen-containing precursor liquid. The liquid deposition may further include rinsing the substrate with a rinsing solution to remove an excess amount and/or unreacted portion of the precursors between the exposing steps. The rinsing solution may comprise deionized water, common organic solvents such as acetone, propylene glyclol monomethyl ether acetate, 1-Methoxy-2-propanol, methyl isobutyl carbinol, hexane, tert-butanol and isopropanol, or mixtures thereof. In another embodiment, the liquid precursors may be mixed first and the mixture solution may be applied to the substrate to grow the photoresist film 102. In one or more embodiments, one of the precursors may be gaseous and another of the precursors may be liquid, and accordingly two different modes (vapor and liquid) of delivery may be utilized to perform the deposition process.

In various embodiments, after forming the photoresist film 102 over the substrate 100, an optional post-apply bake may be performed to remove any excess solvents from a wet process, residual volatile byproducts from a dry process, or both.

FIG. 1C illustrates a cross-sectional view of the substrate 100 after an exposure to a light pattern, such as an EUV exposure. The method further includes, as schematically illustrated in FIG. 1C, exposing the substrate 100 to an EUV light pattern 104. A photomask may be used to create the EUV light pattern 104 by placing the photomask between the substrate 100 and an EUV light source (not illustrated).

In response to the exposure to the EUV light pattern 104, a photoreaction may occur in exposed regions 105 of the photoresist film 102, while unexposed regions 107 remain unchanged. As a result of the photoreaction, the exposed regions 105 may comprise a cross-linked photoresist film, which may have material properties substantially different from the unreacted portion of the photoresist film 102 (i.e., the unexposed regions 107). Such a difference in the material properties includes volatility, reactivity, and/or solubility among others, which gives origin to the tonality as a photoresist.

In various embodiments, after the EUV exposure (see above, FIG. 1C) and prior to a developing step (see below, FIG. 2A), an optional post-exposure bake (PEB) may be performed to further differentiate the material properties between the exposed regions 105 and the unexposed regions 107. In certain embodiments, the PEB may be performed by heating the substrate 100 in a process chamber at a temperature between 70° C. to 250° C., for example between 180° C. to 225° C. in one embodiment, in vacuum or under a gas flow.

Figure 2A:
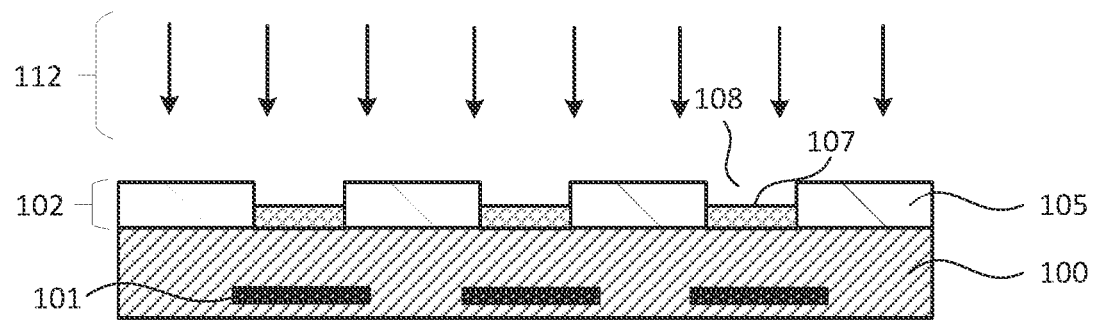
FIG. 2A-2C illustrate steps of an example development process for a photoresist, in accordance with various embodiments.
Figure 2B:
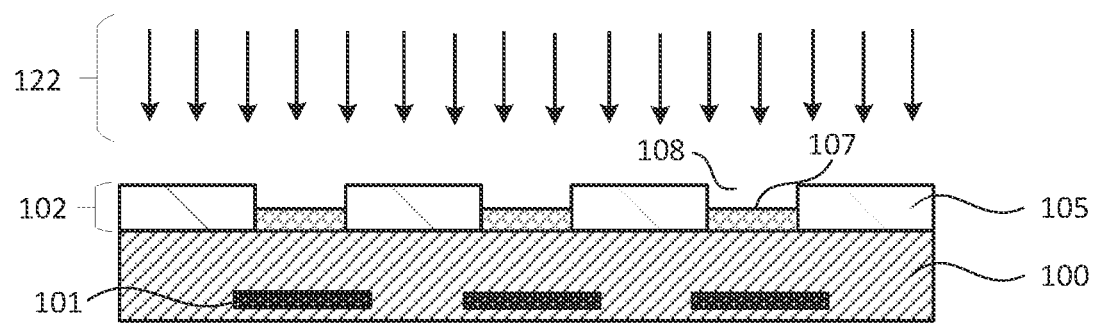
Figure 2C:
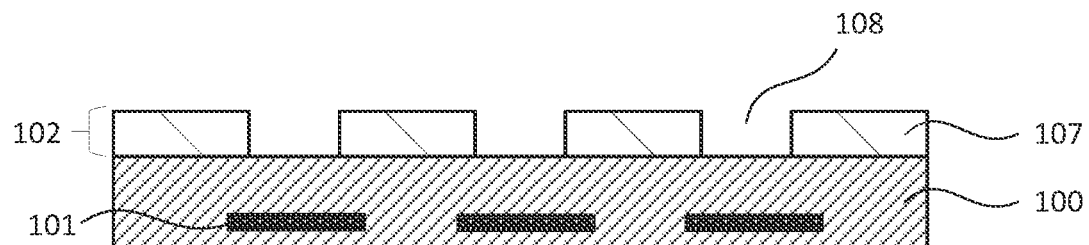

FIGS. 2A-2C illustrate steps of a development process of the photoresist film 102 including a selective gas 112 and a developing gas 122, in accordance with some embodiments. The use of the selective gas 112 in addition to the developing gas 122 increase selectivity of the development process (e.g., a dry etch process) with respect to exposed and unexposed areas of photoresist films.

FIG. 2A follows from FIG. 1C and illustrates a cross-sectional view of the substrate 100 during an introduction of the selective gas 112, in accordance with some embodiments. The substrate 100 is placed in a suitable processing chamber, and the selective gas 112 is flowed into the process chamber. For a negative tune development process (i.e., removal of the unexposed regions 107 of the photoresist film 102), the selective gas 112 may react with the exposed regions 107 of the photoresist film 102 to increase selectivity with the developing gas 122. In various embodiments, the selective gas 112 is water vapor ($H_2O$), chlorine ($Cl_2$), bromine ($Br_2$), methanol, ethanol, isopropyl alcohol, acetylacetone, acetic acid, a Lewis acid (e.g., boron trichloride ($BCl_3$), boron tribromide ($BBr_3$), boron trifluoride ($BF_3$), borane ($BH_3$)), the like, or a combination thereof. In some embodiments in which R represents either hydrogen or an organic moiety with 0 to 10 carbon atoms, the selective gas 112 is a gas with a general formula of ROH, an organic carboxylic acid with a formula of RCOOH, a gas with an amine group with a formula R—NH, the like, or a combination thereof. The selectivity of the development process may be tuned by selecting appropriate chemistry (e.g., boron trichloride ($BCl_3$) or water vapor ($H_2O$)) for the selective gas 112. In some embodiments, the photoresist film 102 is saturated with the selective gas 112 in a first process chamber prior to a development process performed with the developing gas 122 (see below, FIG. 2B) in a second process chamber. The photoresist film 102 may be further exposed to the selective gas 112 in the second process chamber, before, after, or during the introduction of the developing gas 122, or a combination thereof.

In various embodiments, the selective gas 112 is introduced into the process chamber with a flow rate in a range of 1 sccm to 1000 sccm. In some embodiments in which the selective gas 112 is introduced into the process chamber with another gas (e.g., a developing gas; see below, FIG. 2B), the volume percentage flow rate of the selective gas 112 is in a range of 0% to 80%. The selective gas 112 may be introduced into the process chamber at a temperature in the process chamber in a range of −30° C. to 200° C. The selective gas 112 may be flowed into the process chamber under a pressure in a range of 5 mTorr to 100 Torr.

In FIG. 2B, the developing gas 122 is flowed into the process chamber. The developing gas 122 is a different gas from the selective gas 112. In various embodiments, the developing gas 122 comprises an element that is not part of the selective gas 112 or the developing gas 122 has a different molecular structure from the selective gas 112. The developing gas 122 reacts with the unexposed regions 107 of the photoresist film 102 to produce volatile byproducts, which then evaporate from the surface of the substrate 100. This recesses the unexposed regions 107 with respect to the exposed regions 105, forming openings 108 in the photoresist film 102. In some embodiments, the developing gas 122 is an acid (reactive gas) such as an inorganic acid (e.g., hydrogen bromide (HBr), hydrogen chloride (HCl), or the like), an organic acid (e.g., acetic acid, trifluoroacetic acid, hexafluoroacetylacetone, acetylacetone, or the like), a Lewis acid (e.g., boron trichloride ($BCl_3$), boron tribromide ($BBr_3$), or the like), or a combination thereof. In some embodiments, different development steps are performed with different developing gases 110. For example, a first developing step may be performed using hydrogen bromide and a second developing step may be performed using boron trichloride.

The developing step may be performed using a flow rate of the developing gas 122 in a range of 10 sccm to 2000 sccm. The developing step may be performed at a temperature in the process chamber in a range of −30° C. to 200° C. The developing step may be performed for a duration of seconds to 200 seconds.

FIGS. 2A-2B illustrate the selective gas 112 being introduced as a treatment step in FIG. 2A prior to the developing gas 122 being introduced in FIG. 2B. However, any suitable order may be used for introducing the selective gas 112 and the developing gas 122. For example, the selective gas 112 may be introduced into the process chamber simultaneously with the developing gas 122, as alternating steps with the developing gas 122 in a cyclic fashion, or as a combination of some or all of these approaches. In some embodiments, different selective gases 112 are used in different steps of the developing process. For example, a first selective gas may be used in a treatment step prior to introducing the developing gas 122, a second selective gas may be introduced simultaneously with the developing gas 122, and/or a third selective gas may be used in a purging step after the introduction of the developing gas 122. In some embodiments, a non-reacting gas (e.g., argon, nitrogen ($N_2$), carbon dioxide ($CO_2$), the like, or a combination thereof) may be used together with the third selective gas in the purging step following the introduction of the developing gas 122, or the purging step may include the non-reacting gas without a selective gas.

Embodiments may allow for reduction of development dose and exposure time, which can increase process throughput. Embodiments may also allow for tuning of the selectivity of the development process by selecting appropriate chemistry for the selective gas. As an example, using water vapor as the selective gas 112 in a treatment step prior to introducing the developing gas 122 may substantially reduce the etch rate and etch amount of the exposed regions 105 while having a smaller impact on the etch rate and etch amount of the unexposed regions 107, thereby increasing the selectivity of the development process. In embodiments in which the photoresist film comprises tin oxide, a treatment with water vapor as a selective gas 112 prior to an etch with a developing gas 122 (e.g., HBr) may lead to a number of Sn—OH groups in exposed regions 105 that is approximately twice the number of Sn—OH groups in unexposed regions 105. This increased hydrogen bonding in the exposed regions 105 may lead to a smaller etch rate and etch amount in the exposed regions 105 compared to the unexposed regions 107.

As another example, using boron trichloride ($BCl_3$) as the selective gas 112 in one or more purging steps following respective developing steps using HBr as the developing gas 122 may lead to improved selectivity of the development etch by an approximate 75% reduction in the etching of the exposed regions 105. This may be due to boron trichloride bonding with active sites of the exposed regions 105 during the purging cycles, which may protect the exposed regions 105 from etching by the HBr.

FIG. 2C illustrates a cross-sectional view of the substrate 100 after the one or more developing step(s) and one or more purging step(s) of the cyclic development process, in accordance with some embodiments. After the conclusion of the cyclic development process, the exposed regions 105 (see above, FIGS. 1C-2B) have been removed. The openings 108 extend through the remaining unexposed regions 107 of the photoresist film 102. Portions of the top surface of the substrate 100 are exposed through the openings 108. The unexposed regions 107 of the photoresist film 102 may be subsequently used as a mask to etch the substrate 100, e.g. for the formation of conductive features in the substrate 100 (see below, FIGS. 3A-3C). The increased selectivity of the development etch resulting from the use of the selective gas 112 with the developing gas 122 may improve the mask budget for pattern transfer by allowing thicker exposed regions 105 to be left after development.

In the embodiments described above referring to FIGS. 1A-2C, the photoresist film 102 is a negative-tone photoresist. In other embodiments, the photoresist film 102 may form a positive-tone photoresist, where the exposed regions 105 may be removed by the developing step and the unexposed regions 107 remain. In one embodiment, the positive-tone photoresist may be enabled by using a large dose of boron trichloride ($BCl_3$) at a temperature range of −30° C. to 60° C. (e.g., a dose in a range of 5 sccm to 500 sccm) to increase an etch resistance of the unexposed regions 107 after the EUV exposure, while the photoreaction in the exposed regions 105 remains unchanged.

Figure 3A:
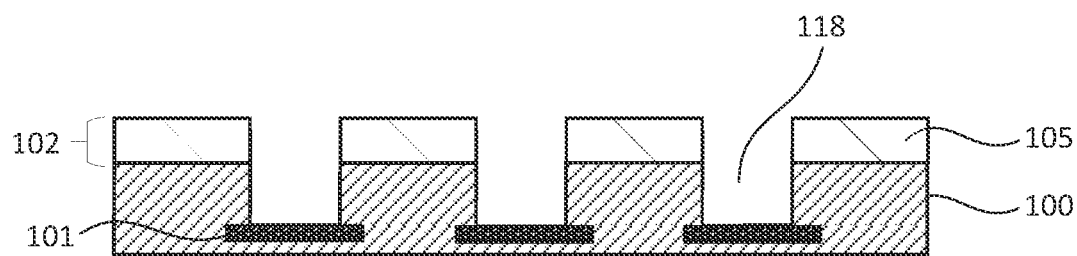
FIGS. 3A-3D illustrate steps of an example fabrication process for forming conductive features in and over a substrate, in accordance with various embodiments.

FIGS. 3A-3D illustrate cross-sectional views of intermediate steps of an example fabrication process for forming conductive features in and over the substrate 100. In FIG. 3A, the openings 108 are extended into the substrate 100 to form openings 118 with a suitable anisotropic etch technique, for example, a reactive ion etch (RIE) process using fluorine chemistry or an atomic layer etching (ALE) process. However, any suitable etching process may be used. The exposed regions 105 of the photoresist film 102 remain over the substrate 100 and act as a mask for the etching process. In some embodiments, the openings 118 expose top surfaces of conductive features 101 (e.g., metal lines) embedded in the substrate 100. Exposed regions 105 left after development with thickness increased by the improved selectivity resulting from using the selective gas 112 with the developing gas 122 may allow for forming deeper openings 118. This can enable pattern transfer to thicker underlying layers of the substrate 100.

Figure 3B:
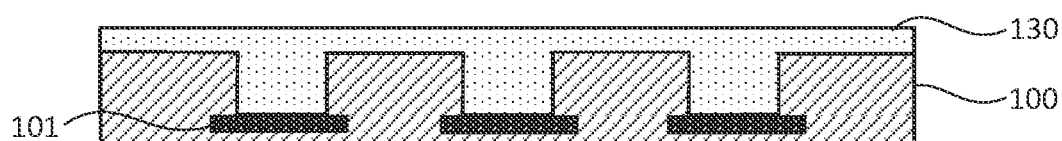

In FIG. 3B, the exposed regions 105 of the photoresist film 102 are removed from over the substrate 100, residues from the etching and planarizing processes are removed, and a conductive material 130 is formed over the substrate 100.

The exposed regions 105 of the photoresist film 102 may be removed with a suitable process, such as a planarization process (e.g., a CMP) or the like. In some embodiments, residues from the etching and planarizing process are removed with a suitable cleaning process, such as a rinse with deionized water, hydrogen peroxide, SC-1, the like, or a combination thereof.

Still referring to FIG. 3B, a conductive material 130 is formed over the substrate 100 to fill the openings 118 (see above, FIG. 3A). As an example of forming the conductive material 130, a conformal barrier metal (e.g., TiN or TaN) liner is formed over the exposed surfaces of the substrate 100. Next, the openings 118 are filled with a conductive material 130 such as a metal. For example, the conductive material 130 may be copper formed using electroplating. However, any suitable conductive material and deposition method may be used. In some embodiments, the conductive material 130 makes electrical and physical contact with top surfaces of the conductive features 101.

Figure 3C:
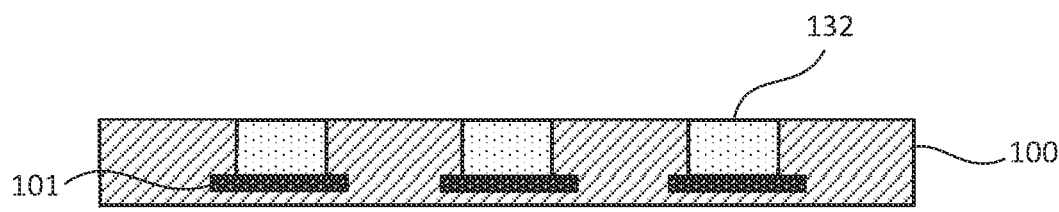

Next, in FIG. 3C, excess conductive material is removed from the top surface of the substrate 100 using a planarization process (e.g., a CMP), thereby forming conductive features 132 inlaid in the substrate 100. In various embodiments, the conductive features 132 are high aspect ratio features. The conductive features 132 may be conductive vias that physically and electrically couple with conductive features 101 of the substrate 100.

Figure 3D:
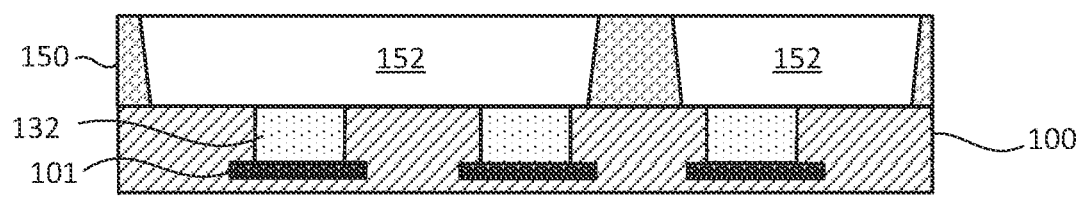

In FIG. 3D, an interconnect layer is formed over the substrate 100 and the conductive features 132. The interconnect layer includes an intermetal dielectric (IMD) 150 with conductive lines 152 formed therein. The IMD 150 comprises an insulating material such as $SiO_2$ or a silicon oxide based low-k dielectric (e.g., porous oxides, fluorosilicate glass (FSG), and orthosilicate glass (OSG)). In some embodiments, the IMD 150 includes a bottom layer that is an etch stop layer (ESL) that comprises a dielectric such as $Si_3N_4$, $SiO_xN_y$, SiC, or SiCN (not shown). The IMD 150 may be formed with a suitable process such as CVD or the like.

Still referring to FIG. 3D, conductive lines 152 may be formed with, for example, a conventional damascene process using a conductive material such as copper or the like. As known by a person skilled in the art, the damascene flow comprises patterning openings (e.g., trenches for conductive lines 152) in the IMD 150, depositing a conformal barrier metal (e.g., TiN or TaN) liner, filling the openings with metal (e.g., using Cu electroplating), and removing all excess conductive material from the top surface of the IMD 150 using a planarization process such as chemical mechanical planarization (CMP), thereby forming the conductive lines 152 inlaid in the IMD 150. In some embodiments, each conductive line 152 is formed to electrically and physically couple with one or more underlying conductive features 132 (e.g., conductive vias).

Figure 4:
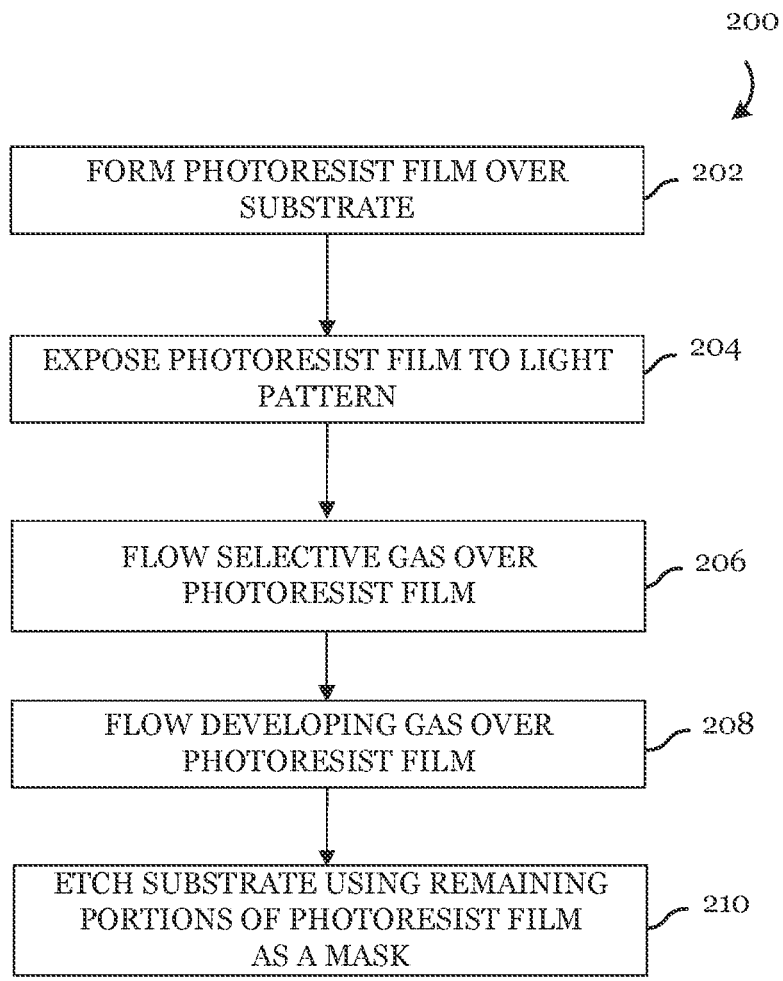
FIG. 4 illustrates a process flow chart diagram of a method for processing a substrate, in accordance with various embodiments.

FIG. 4 illustrates a process flow chart diagram of a method 200 for processing a substrate, in accordance with some embodiments. In step 202, a photoresist film 102 (e.g., a metal oxide resist) is formed over a substrate 100, as described above with respect to FIG. 1B. In step 204, the photoresist film 102 is exposed to a light pattern (e.g., an EUV light pattern 104), which forms a pattern of exposed regions 105 and unexposed regions 107 of the photoresist film 102 as described above with respect to FIG. 1C.

In step 206, a selective gas 112 is flowed over the photoresist film 102, as described above with respect to FIG. 2A. In some embodiments, the selective gas 112 is water vapor and step 206 is a treatment step that increases selectivity of the subsequent developing step 208. In step 208, a developing gas 122 is flowed over the photoresist film 102, as described above with respect to FIG. 2A.

In step 210, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 5:
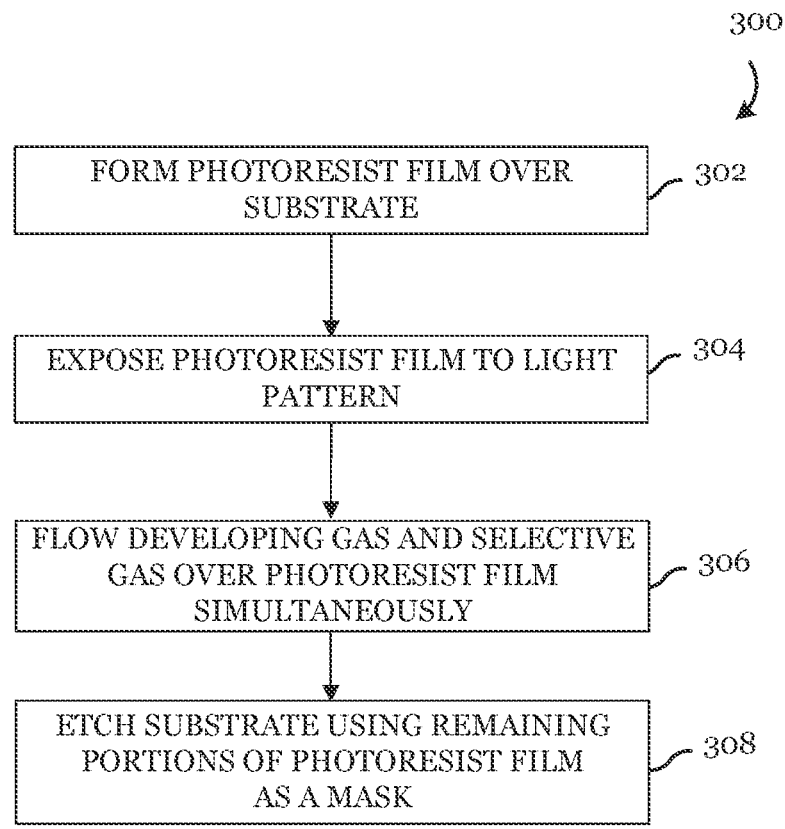
FIG. 5 illustrates a process flow chart diagram of a method for processing a substrate, in accordance with various embodiments.

FIG. 5 illustrates a process flow chart diagram of a method 300 for processing a substrate, in accordance with some embodiments. In step 302, a photoresist film 102 (e.g., a metal oxide resist) is formed over a substrate 100, as described above with respect to FIG. 1B. In step 304, the photoresist film 102 is exposed to a light pattern (e.g., an EUV light pattern 104), which forms a pattern of exposed regions 105 and unexposed regions 107 of the photoresist film 102 as described above with respect to FIG. 1C.

In step 306, a developing gas 122 and a selective gas 112 are flowed over the photoresist film 102 simultaneously, as described above with respect to FIGS. 2A and 2B. In step 308, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 6:
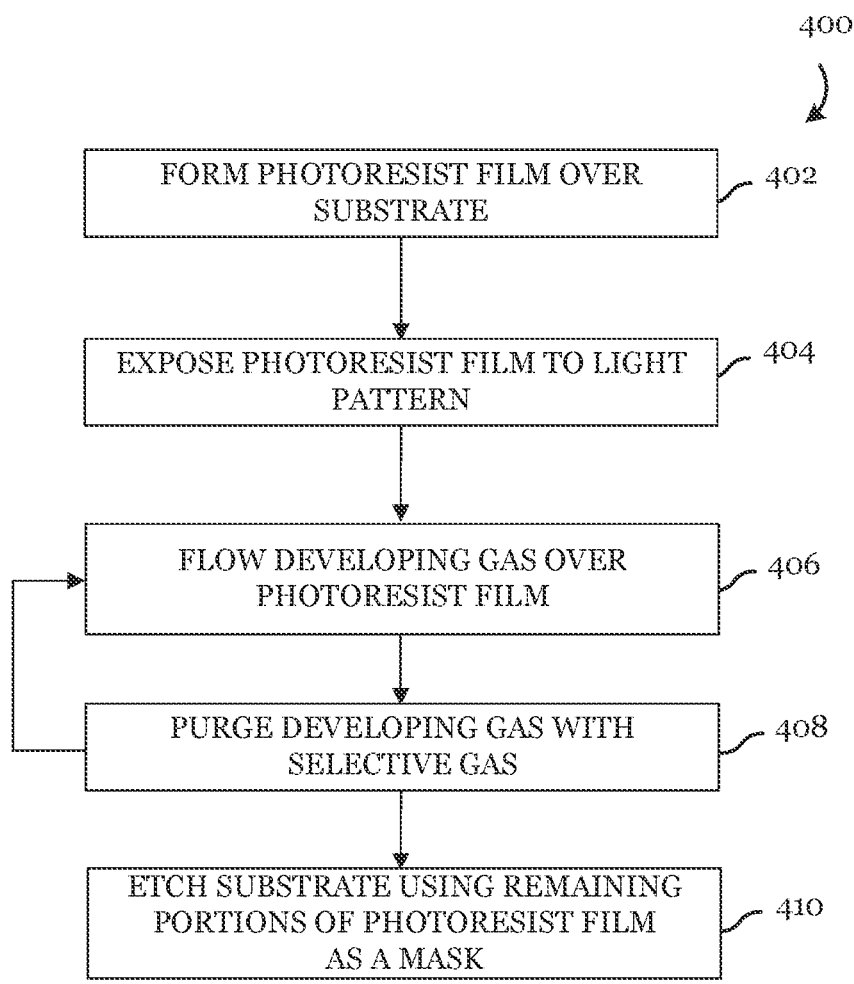
FIG. 6 illustrates a process flow chart diagram of a method for processing a substrate, in accordance with various embodiments.

FIG. 6 illustrates a process flow chart diagram of a method 400 for processing a substrate, in accordance with some embodiments. In step 402, a photoresist film 102 (e.g., a metal oxide resist) is formed over a substrate 100, as described above with respect to FIG. 1B. In step 404, the photoresist film 102 is exposed to a light pattern (e.g., an EUV light pattern 104), which forms a pattern of exposed regions 105 and unexposed regions 107 of the photoresist film 102 as described above with respect to FIG. 1C.

Step 406 and step 408 are one cycle of a cyclic development process that is performed in a process chamber on the photoresist film 102. In step 406, a developing gas 122 is flowed over the photoresist film 102, as described above with respect to FIG. 2A. In step 408, the developing gas 122 is purged from the process chamber by flowing a selective gas 112, as described above with respect to FIG. 2A. In various embodiments, step 404 and step 408 are repeated for a suitable number of cycles, such as 1 cycle to 50 cycles. In some embodiments, the developing gas 122 is HBr and the selective gas is $BCl_3$. In some embodiments, different developing gases 122 and/or different selective gases 112 are used for different cycles of the cyclic development process.

In step 410, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 7:
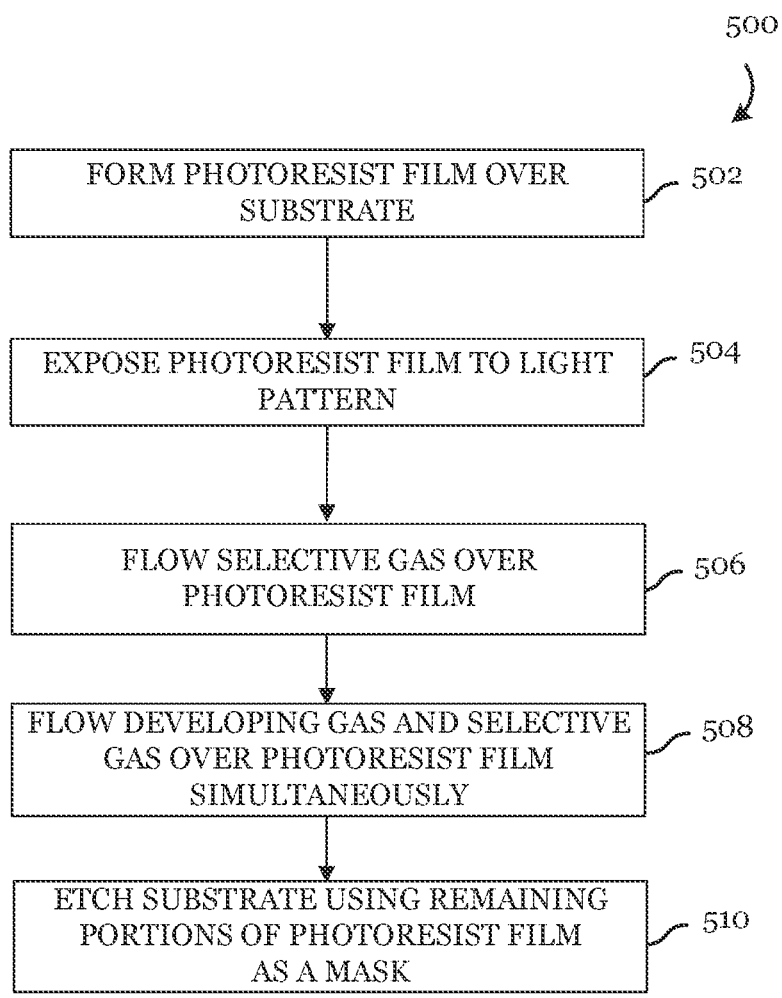
FIG. 7 illustrates a process flow chart diagram of a method for processing a substrate, in accordance with various embodiments.

FIG. 7 illustrates a process flow chart diagram of a method 500 for processing a substrate, in accordance with some embodiments. In step 502, a photoresist film 102 (e.g., a metal oxide resist) is formed over a substrate 100, as described above with respect to FIG. 1B. In step 504, the photoresist film 102 is exposed to a light pattern (e.g., an EUV light pattern 104), which forms a pattern of exposed regions 105 and unexposed regions 107 of the photoresist film 102 as described above with respect to FIG. 1C.

In step 506, a first selective gas 112 is flowed over the photoresist film 102, as described above with respect to FIG. 2A. In some embodiments, the first selective gas 112 is water vapor and step 506 is a treatment step that increases selectivity of the subsequent developing step 508.

In step 508, a developing gas 122 and a second selective gas 112 are flowed over the photoresist film 102 simultaneously, as described above with respect to FIGS. 2A and 2B. In some embodiments, the first selective gas 112 and the second selective gas 112 are the same gas. In other embodiments, the first selective gas 112 and the second selective gas 112 are different gases. For example, the first selective gas 112 may be $BCl_3$ and the second selective gas 112 may be water vapor.

In step 510, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 8:
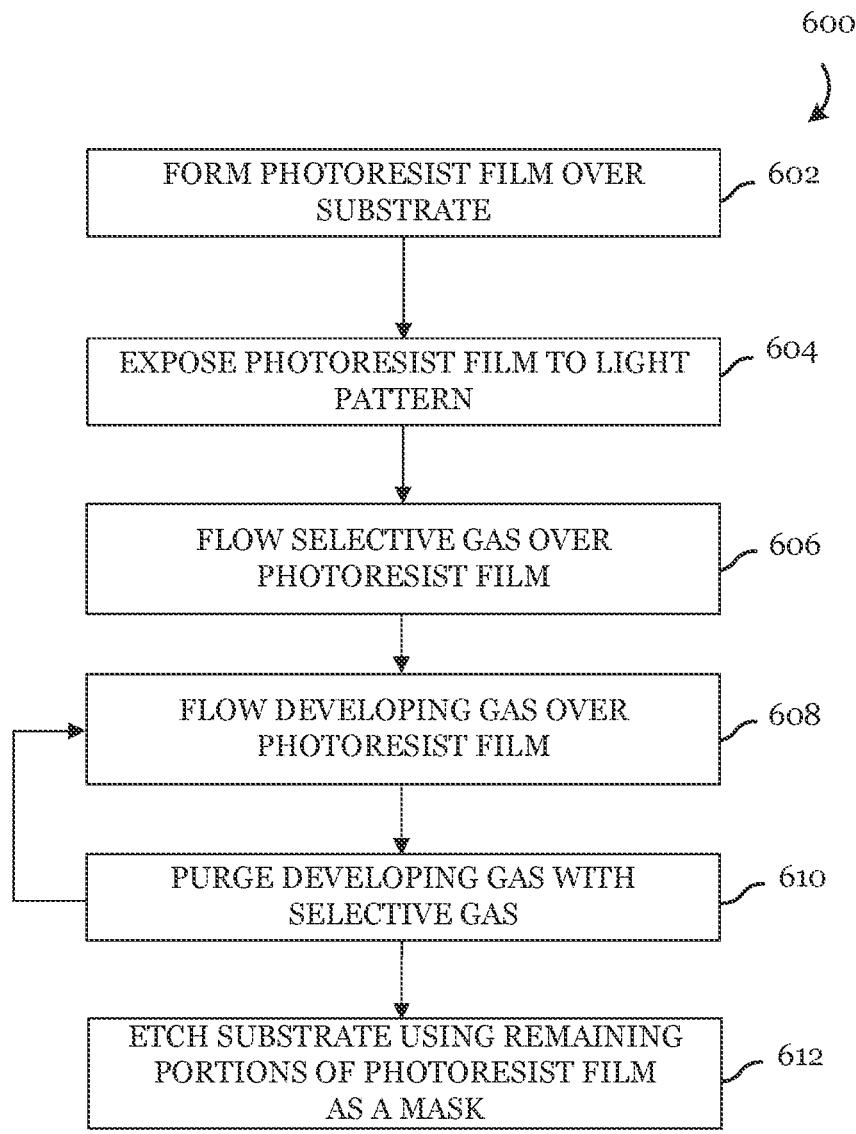
FIG. 8 illustrates a process flow chart diagram of a method for processing a substrate, in accordance with various embodiments.

FIG. 8 illustrates a process flow chart diagram of a method 600 for processing a substrate, in accordance with some embodiments. In step 602, a photoresist film 102 (e.g., a metal oxide resist) is formed over a substrate 100, as described above with respect to FIG. 1B. In step 604, the photoresist film 102 is exposed to a light pattern (e.g., an EUV light pattern 104), which forms a pattern of exposed regions 105 and unexposed regions 107 of the photoresist film 102 as described above with respect to FIG. 1C.

In step 506, a first selective gas 112 is flowed over the photoresist film 102, as described above with respect to FIG. 2A. In some embodiments, the first selective gas 112 is water vapor and step 506 is a treatment step that increases selectivity of the subsequent developing step 508.

Step 608 and step 610 are one cycle of a cyclic development process that is performed in a process chamber on the photoresist film 102, as described above with respect to step 606 and step 608, respectively, as illustrated in FIG. 6. In step 606, a developing gas 122 is flowed over the photoresist film 102, as described above with respect to FIG. 2A. In step 608, the developing gas 122 is purged from the process chamber by flowing a second selective gas 112, as described above with respect to FIG. 2A. In various embodiments, step 606 and step 608 are repeated for a suitable number of cycles, such as 1 cycle to 50 cycles. In some embodiments, the first selective gas 112 and the second selective gas 112 are the same gas. In other embodiments, the first selective gas 112 and the second selective gas 112 are different gases.

In step 612, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 9:
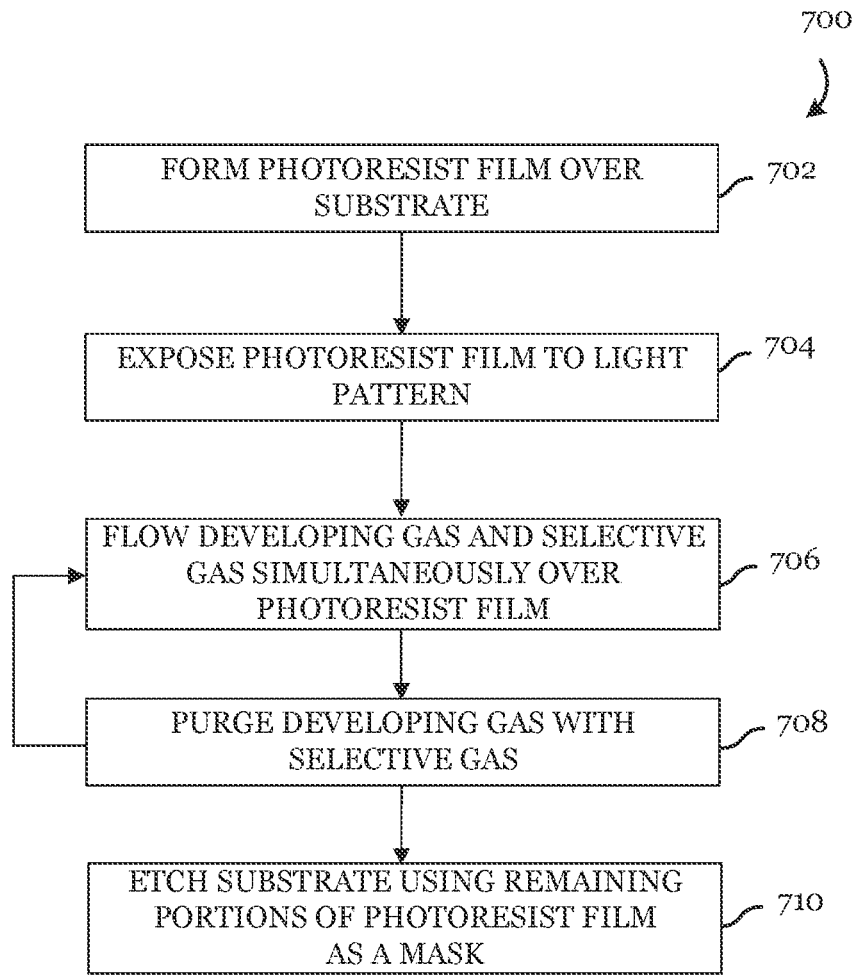
FIG. 9 illustrates a process flow chart diagram of a method for processing a substrate, in accordance with various embodiments.

FIG. 9 illustrates a process flow chart diagram of a method 700 for processing a substrate, in accordance with some embodiments. In step 702, a photoresist film 102 (e.g., a metal oxide resist) is formed over a substrate 100, as described above with respect to FIG. 1B. In step 704, the photoresist film 102 is exposed to a light pattern (e.g., an EUV light pattern 104), which forms a pattern of exposed regions 105 and unexposed regions 107 of the photoresist film 102 as described above with respect to FIG. 1C.

Step 706 and step 708 are one cycle of a cyclic development process that is performed in a process chamber on the photoresist film 102. In step 706, a developing gas 122 and a first selective gas 112 are flowed over the photoresist film 102 simultaneously, as described above with respect to FIGS. 2A and 2B. In step 708, the developing gas 122 is purged from the process chamber by flowing a second selective gas 112, as described above with respect to FIG. 2A. In various embodiments, step 706 and step 708 are repeated for a suitable number of cycles, such as 1 cycle to 50 cycles. In some embodiments, the first selective gas 112 and the second selective gas 112 are the same gas. In other embodiments, the first selective gas 112 and the second selective gas 112 are different gases.

In step 710, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 10:
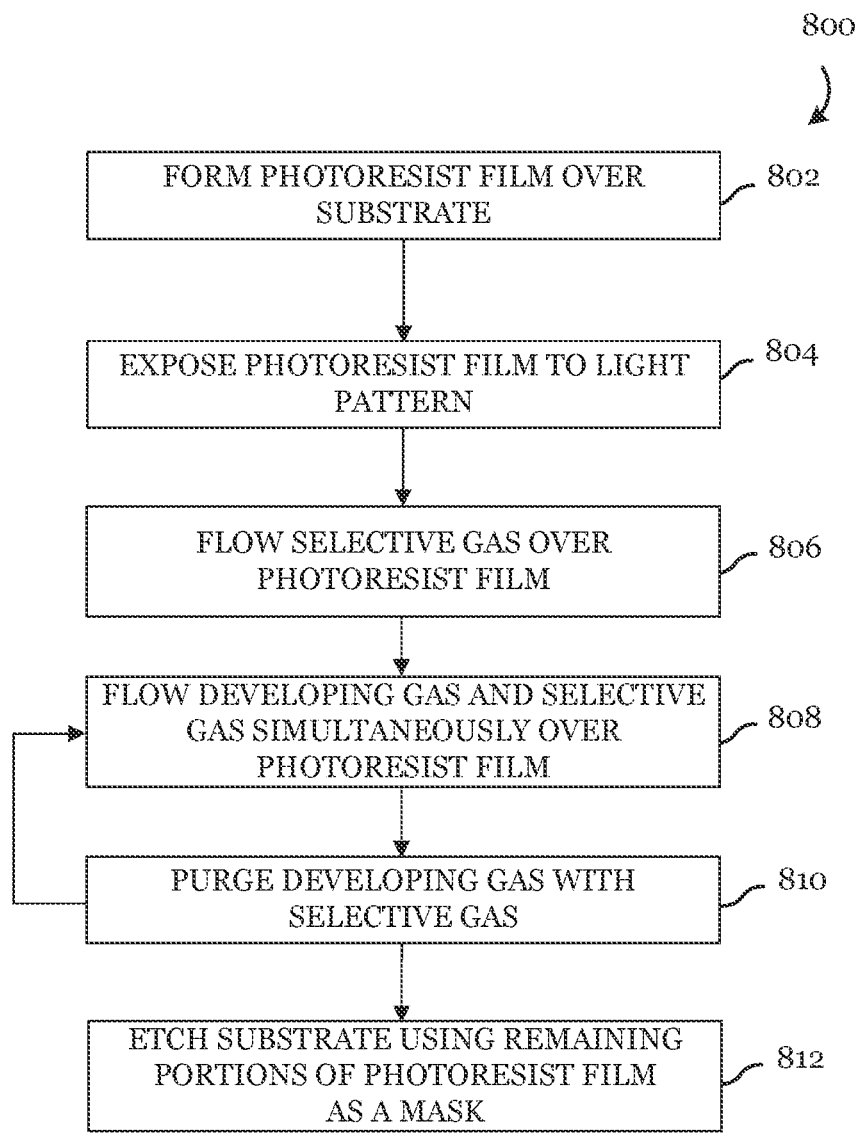
FIG. 10 illustrates a process flow chart diagram of a method for processing a substrate, in accordance with various embodiments.

FIG. 10 illustrates a process flow chart diagram of a method 800 for processing a substrate, in accordance with some embodiments. In step 802, a photoresist film 102 (e.g., a metal oxide resist) is formed over a substrate 100, as described above with respect to FIG. 1B. In step 804, the photoresist film 102 is exposed to a light pattern (e.g., an EUV light pattern 104), which forms a pattern of exposed regions 105 and unexposed regions 107 of the photoresist film 102 as described above with respect to FIG. 1C.

In step 806, a first selective gas 112 is flowed over the photoresist film 102, as described above with respect to FIG. 2A. In some embodiments, the first selective gas 112 is water vapor and step 806 is a treatment step that increases selectivity of the subsequent developing step 808.

Step 808 and step 810 are one cycle of a cyclic development process that is performed in a process chamber on the photoresist film 102. In step 808, a developing gas 122 and a second selective gas 112 are flowed over the photoresist film 102 simultaneously, as described above with respect to FIGS. 2A and 2B. In step 810, the developing gas 122 is purged from the process chamber by flowing a third selective gas 112, as described above with respect to FIG. 2A. In various embodiments, step 806 and step 810 are repeated for a suitable number of cycles, such as 1 cycle to 50 cycles. In some embodiments, the first selective gas 112, the second selective gas 112, and the third selective gas 112 are the same gas. In other embodiments, one or more of the first selective gas 112, the second selective gas 112, and the third selective gas 112 are different gases.

In step 812, the substrate 100 is etched to form openings 118 using remaining portions of the photoresist film 102 (e.g., the exposed regions 105) as a mask, as described above with respect to FIG. 3A. Subsequently, conductive features may be formed in the openings 118, as described above with respect to FIGS. 3B-3C.

Figure 11:
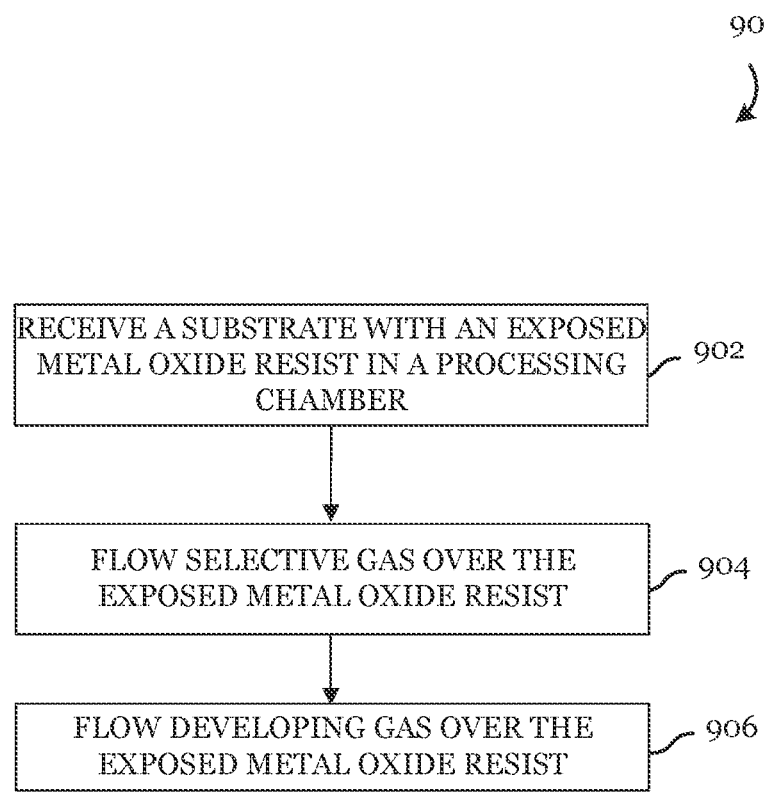
FIG. 11 illustrates a process flow chart diagram of a method for processing a substrate, in accordance with various embodiments.

FIG. 11 illustrates a process flow chart diagram of a method 900 for processing a substrate, in accordance with some embodiments. In step 902, a substrate 100 with an exposed metal oxide resist 102 is received in a processing chamber, as described above with respect to FIG. 2A. The exposed metal oxide resist 102 comprises exposed portions 105 and unexposed portions 107.

In step 904, a selective gas 112 is flowed over the exposed metal oxide resist, as described above with respect to FIG. 2A. The selective gas 112 increases a selectivity between the exposed portions 105 and the unexposed portions 107 of the exposed metal oxide resist 102 to a developing gas. In step 906, a developing gas 122 is flowed over the exposed metal oxide resist 102 in the processing chamber, as described above with respect to FIG. 2B.

Example embodiments of the disclosure are summarized here. Other embodiments can also be understood from the entirety of the specification as well as the claims filed herein.

Example 1. A method for processing a substrate, the method including: receiving a first substrate with an exposed metal oxide resist in a processing chamber, the exposed metal oxide resist including exposed portions and unexposed portions; flowing a selective gas over the exposed metal oxide resist, where the selective gas increases a selectivity between the exposed portions and unexposed portions of the exposed metal oxide resist to a developing gas; and flowing the developing gas over the exposed metal oxide resist in the processing chamber.

Example 2. The method of example 1, where the selective gas includes a hydroxide group, an amine group, an organic carboxylic acid, or a Lewis acid.

Example 3. The method of example 1, where the selective gas includes water vapor, boron trichloride, chlorine, methanol, ethanol, isopropyl alcohol, acetylacetone, or acetic acid.

Example 4. The method of one of examples 1 to 3, where the exposed metal oxide resist includes tin (Sn), antimony (Sb), hafnium (Hf), zirconium (Zr), or zinc (Zn).

Example 5. The method of one of examples 1 to 3, where the exposed metal oxide resist includes a metal alkoxide or a methacrylate (MAA) of Sn, Sb, Hf, Zr, or Zn.

Example 6. The method of one of examples 1 to 3, where the exposed metal oxide resist includes a polymeric film.

Example 7. The method of one of examples 1 to 3, where the exposed metal oxide resist includes a metal and a group bonded to the metal, where the group is represented by a chemical formula selected from the list of —OR, —OR', —OAr, and —OOCR, where R is an alkyl group, R' is an alkene group, and Ar is an aryl group.

Example 8. The method of one of examples 1 to 7, where the developing gas includes hydrogen bromide (HBr) or hydrogen chloride (HCl).

Example 9. The method of one of examples 1 to 7, where the developing gas includes an acetic acid, a trifluoroacetic acid, hexafluoroacetylacetone, acetylacetone, boron trichloride ($BCl_3$), or boron tribromide ($BBr_3$).

Example 10. A method for processing a substrate, the method including: forming a metal oxide resist over the substrate; exposing the metal oxide resist to an extreme ultraviolet light pattern; flowing a first selective gas over the metal oxide resist in a processing chamber; after flowing the first selective gas, simultaneously flowing a developing gas and a second selective gas over the metal oxide resist in the processing chamber, where the developing gas includes an element that is not part of the first selective gas or the second selective gas; and etching the substrate using remaining portions of the metal oxide resist as a mask.

Example 11. The method of example 10, where the first selective gas and the second selective gas are a same gas.

Example 12. The method of example 10, where the first selective gas and the second selective gas are different gases.

Example 13. The method of one of examples 1 to 12, where the first selective gas includes boron trichloride.

Example 14. The method of one of examples 1 to 13, where the developing gas includes hydrogen bromide and the second selective gas includes water vapor.

Example 15. A method for processing a substrate, the method including: forming a metal oxide resist over the substrate; exposing the metal oxide resist to an extreme ultraviolet light pattern; flowing a first developing gas over the metal oxide resist in a processing chamber; purging the first developing gas from the processing chamber with a first selective gas, the first selective gas having a different molecular structure from the first developing gas; after purging the first developing gas, flowing a second developing gas over the metal oxide resist in the processing chamber; and etching the substrate using remaining portions of the metal oxide resist as a mask.

Example 16. The method of example 15, where the first developing gas and the second developing gas are a same gas.

Example 17. The method of example 16, where the same gas includes hydrogen bromide.

Example 18. The method of one of examples 15 to 17, where the first selective gas includes water vapor.

Example 19. The method of one of examples 15 to 18, where the first selective gas includes boron trichloride.

Example 20. The method of one of examples 15 to 19, further including, before flowing the first developing gas, flowing a second selective gas over the metal oxide resist in the processing chamber, where the second selective gas increases a second selectivity of the exposed metal oxide resist to the first developing gas.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method for processing a substrate, the method comprising: receiving a first substrate with an exposed metal oxide resist in a processing chamber, the exposed metal oxide resist comprising exposed portions and unexposed portions; flowing a selective gas over the exposed metal oxide resist, wherein the selective gas increases a selectivity between the exposed portions and unexposed portions of the exposed metal oxide resist to a developing gas, the selective gas comprising boron trichloride (BCl3); and after flowing the selective gas, flowing the developing gas over the exposed metal oxide resist in the processing chamber.

2. The method of claim 1, wherein the exposed metal oxide resist comprises tin (Sn), antimony (Sb), hafnium (Hf), zirconium (Zr), or zinc (Zn).

3. The method of claim 1, wherein the exposed metal oxide resist comprises a metal alkoxide or a methacrylate (MAA) of Sn, Sb, Hf, Zr, or Zn.

4. The method of claim 1, wherein the exposed metal oxide resist comprises a polymeric film.

5. The method of claim 1, wherein the exposed metal oxide resist comprises a metal and a group bonded to the metal, wherein the group is represented by a chemical formula selected from the list of —OR, —OR', —OAr, and —OOCR, where R is an alkyl group, R' is an alkene group, and Ar is an aryl group.

6. The method of claim 1, wherein the developing gas comprises hydrogen bromide (HBr) or hydrogen chloride (HCl).

7. The method of claim 1, wherein the developing gas comprises an acetic acid, a trifluoroacetic acid, hexafluoroacetylacetone, acetylacetone, boron trichloride ($BCl_3$), or boron tribromide ($BBr_3$).

8. The method of claim 1, wherein the selective gas and the developing gas are flowed over the exposed metal oxide resist simultaneously.

9. The method of claim 1, wherein flowing the selective gas purges the developing gas from the processing chamber.

10. A method for processing a substrate, the method comprising:
  forming a metal oxide resist over the substrate;
  exposing the metal oxide resist to an extreme ultraviolet light pattern;
  flowing a first selective gas over the metal oxide resist in a processing chamber, the first selective gas comprising boron trichloride;
  after flowing the first selective gas, simultaneously flowing a developing gas and a second selective gas over the metal oxide resist in the processing chamber, wherein the developing gas comprises an element that is not part of the first selective gas or the second selective gas; and
  etching the substrate using remaining portions of the metal oxide resist as a mask.

11. The method of claim 10, wherein the first selective gas and the second selective gas are a same gas.

12. The method of claim 10, wherein the first selective gas and the second selective gas are different gases.

13. The method of claim 10, wherein the developing gas comprises hydrogen bromide and the second selective gas comprises water vapor.

14. The method of claim 10, wherein the first selective gas is provided at a dose in a range of 5 sccm to 500 sccm.

15. A method for processing a substrate, the method comprising:
  forming a metal oxide resist over the substrate;
  exposing the metal oxide resist to an extreme ultraviolet light pattern;
  flowing a first developing gas over the metal oxide resist in a processing chamber;
  purging the first developing gas from the processing chamber with a first selective gas, the first selective gas having a different molecular structure from the first developing gas, the first selective gas comprising boron trichloride;
  after purging the first developing gas, flowing a second developing gas over the metal oxide resist in the processing chamber; and
  etching the substrate using remaining portions of the metal oxide resist as a mask.

16. The method of claim 15, wherein the first developing gas and the second developing gas are a same gas.

17. The method of claim 16, wherein the same gas comprises hydrogen bromide.

18. The method of claim 15, further comprising, before flowing the first developing gas, flowing a second selective gas over the metal oxide resist in the processing chamber, wherein the second selective gas increases a second selectivity of the exposed metal oxide resist to the first developing gas.

19. The method of claim 15, further comprising flowing a second selective gas over the metal oxide resist in the processing chamber simultaneously with flowing the second developing gas.

20. The method of claim 19, wherein the second selective gas comprises water vapor.

* * * * *